United States Patent
Liu et al.

(10) Patent No.: US 10,241,942 B2
(45) Date of Patent: Mar. 26, 2019

(54) METHOD AND APPARATUS FOR MEMORY ACCESS

(71) Applicant: MEDIATEK INC., Hsinchu (TW)

(72) Inventors: Chia-Hsien Liu, Taichung (TW); Hsiang-I Huang, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 15/585,989

(22) Filed: May 3, 2017

(65) Prior Publication Data

US 2017/0371815 A1    Dec. 28, 2017

Related U.S. Application Data

(60) Provisional application No. 62/355,348, filed on Jun. 28, 2016.

(51) Int. Cl.
| | |
|---|---|
| *G06F 13/16* | (2006.01) |
| *G06F 13/40* | (2006.01) |
| *G11C 7/10* | (2006.01) |
| *G11C 7/22* | (2006.01) |

(52) U.S. Cl.
CPC ...... *G06F 13/1689* (2013.01); *G06F 13/4068* (2013.01); *G11C 7/10* (2013.01); *G11C 7/22* (2013.01)

(58) Field of Classification Search
CPC .............................. G06F 13/1689; G11C 7/22
See application file for complete search history.

(56) References Cited

U.S. PATENT DOCUMENTS

| | | | |
|---|---|---|---|
| 7,042,263 B1 * | 5/2006 | Johnson | .................... G06F 1/08 326/38 |
| 7,716,443 B2 | 5/2010 | Seo et al. | |
| 7,886,122 B2 | 2/2011 | Oh | |
| 7,911,858 B2 | 3/2011 | Sugishita | |

(Continued)

FOREIGN PATENT DOCUMENTS

| | | |
|---|---|---|
| TW | I265423 | 11/2006 |
| TW | 200739596 A | 10/2007 |
| TW | I479321 B | 4/2015 |

OTHER PUBLICATIONS

Combined Office Action and Search Report dated May 23, 2018 in Taiwanese Patent Application No. 106121231 (with English translation of categories of cited documents) citing references AA-AC and AO-AQ therein, 4 pages.

*Primary Examiner* — Farley Abad
(74) *Attorney, Agent, or Firm* — Oblon, McClelland, Maier & Neustadt, L.L.P.

(57) ABSTRACT

Aspects of the disclosure provide an integrated circuit (IC) chip that includes interface circuits and a control circuit. The interface circuits is configured to interface the IC chip to buses that couple the IC chip with a memory chip, to drive signals onto the buses for transmission to the memory chip and to receive signals that are transmitted on the buses from the memory chip. The control circuit is configured to receive a ratio change of transmission rates for command signals and data signals, control the interface circuits to transmit information signals to the memory chip to inform the ratio change, configure the interface circuits according to the ratio change, and allow the interface circuits to start transmit/receive signals according to the ratio change at a time.

20 Claims, 8 Drawing Sheets

(56) References Cited

U.S. PATENT DOCUMENTS

| | | | |
|---|---|---|---|
| 9,496,006 B2 * | 11/2016 | Doering | G11C 5/04 |
| 2002/0147892 A1 * | 10/2002 | Rentschler | G06F 13/1689 |
| | | | 711/154 |
| 2008/0250220 A1 * | 10/2008 | Ito | G06F 12/0246 |
| | | | 711/173 |

* cited by examiner

METHOD AND APPARATUS FOR MEMORY ACCESS

INCORPORATION BY REFERENCE

This present disclosure claims the benefit of U.S. Provisional Application No. 62/355,348, "High Speed Interface for Dynamic Random Access Memory" filed on Jun. 28, 2016, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, an electronic device, such as a computer system, can include one or more memory chips. In an example, the electronic device includes a memory controller on a different integrated circuit (IC) chip to manage memory access to the memory chips. The memory controller provides commands, such as read commands, write commands and the like, to the memory chips to manage data to the memory chips and data from the memory chips. For example, according to a write command, data is written into a memory chip; and according to a read command, data is read from a memory chip in an example.

SUMMARY

Aspects of the disclosure provide an integrated circuit (IC) chip that includes interface circuits and a control circuit. The interface circuits is configured to interface the IC chip to buses that couple the IC chip with a memory chip, to drive signals onto the buses for transmission to the memory chip and to receive signals that are transmitted on the buses from the memory chip. The control circuit is configured to receive or determine a ratio change of transmission rates for command signals and data signals, control the interface circuits to transmit information signals to the memory chip to inform the ratio change, configure the interface circuits according to the ratio change, and allow the interface circuits to start transmit/receive signals according to the ratio change at a time.

In an embodiment, the control circuit is configured to control the interface circuits to transmit command signals to the memory chip to inform the ratio change. In another embodiment, the control circuit is configured to control the interface circuits to change a characteristic of a clock signal to the memory chip to indicate the ratio change. In an example, the control circuit is configured to cause the clock signal to stop to indicate the ratio change. Then, the control circuit is configured to cause the clock signal to restart after the time to allow the interface circuits to transmit/receive signals according to the ratio change. In another example, the control circuit is configured to control the interface circuits to cause a frequency change of the clock signal to indicate the ratio change. Then, the control circuit is configured to control the interface circuits to transmit command signals at the time after the frequency change to allow the interface circuits to start transmit/receive signals according to the ratio change.

In an example, the control circuit is configured to determine or receive the ratio change between a command rate for transmitting command signals and a data rate for transmitting data signals. In another example, the control circuit is configured to determine or receive the ratio change between the command rate and a data clock configured to assist driving and/or receiving data signals from the buses. In another example, the control circuit is configured to determine or receive the ratio change between a command clock configured to assist driving and/or receiving command signals from the buses and the data rate. In another example, the control circuit is configured to determine or receive the ratio change between the command clock and the data clock.

According to an aspect of the disclosure, the IC chip includes a data strobe generation circuit configured to generate a data strobe signal based on a clock signal with a configurable ratio. The control circuit is configured to change the configurable ratio according to the ratio change.

In an embodiment, the ratio change is in a direction to cause that the transmission rate for the command signals changes less significantly than the transmission rate of the data signals. In another embodiment, the ratio change is in a direction to reduce the transmission rate for the command signals and maintain the transmission rate for the data signals.

Aspects of the disclosure provide an apparatus that includes a first integrated (IC) chip, a second IC chip and interconnection components configured to form buses to interconnect the first chip with the second IC chip. The second IC chip that is a memory IC chip. The first IC chip includes first interface circuits configured to interface the first IC chip to the buses that couple the first IC chip with the second IC chip, to drive signals to the buses for transmission to the second IC chip and to receive signals that are transmitted on the buses from the second IC chip. Further, the first IC chip includes a first control circuit configured to determine or receive a ratio change of transmission rates for command signals and data signals, control the first interface circuits to transmit information signals to the second IC chip to inform the ratio change, configure the first interface circuits according to the ratio change, and allow the first interface circuits to start transmit/receive signals according to the ratio change at a time.

According to an aspect of the disclosure, the second IC chip includes memory arrays for data storage, second interface circuits configured to interface the memory arrays to the buses and a second control circuit configured to detect the ratio change indicated by the information signals, configure the second interface circuits according to the ratio change, and monitor the second interface circuits to start transmit/receive signals according to the ratio change. In an example, the second IC chip includes a second data strobe generation circuit configured to generate a data strobe signal based on a received clock signal with a configurable ratio. The second control circuit is configured to change a configurable ratio according to the ratio change.

Aspects of the disclosure provide a method for memory access. The method includes determining, by a control circuit in an integrated circuit (IC) chip, a ratio change of transmission rates for command signals and data signals on buses that couple the IC chip with a memory chip, controlling interface circuits of the IC chip to transmit information signals to the memory chip to inform the ratio change, configuring the interface circuits according to the ratio change and scheduling a time to allow the interface circuits to start transmit/receive signals according to the ratio change.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
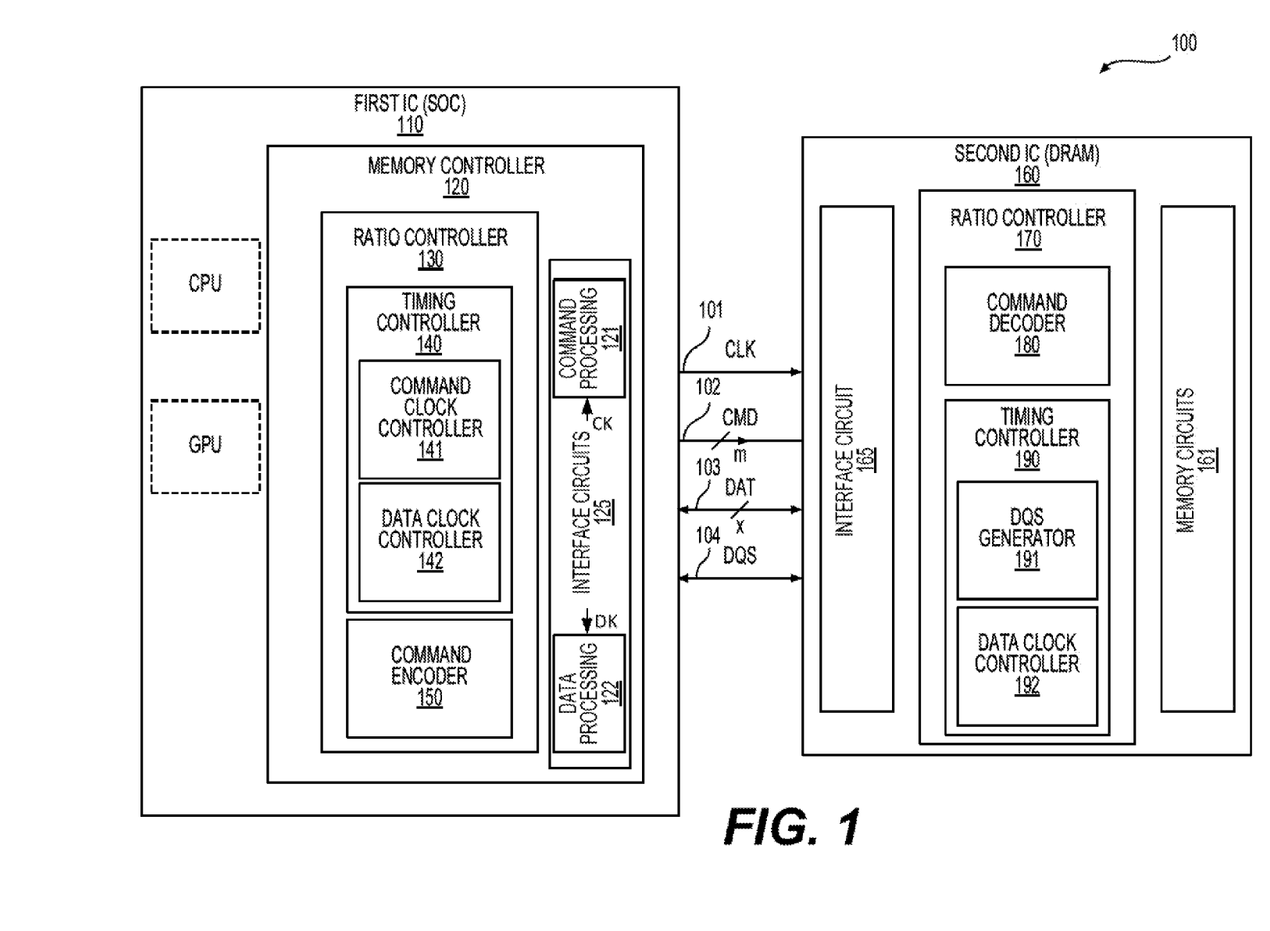
FIG. 1 shows a block diagram of a system 100 according to an embodiment of the disclosure.

FIG. 1 shows a block diagram of a system 100 according to an embodiment of the disclosure. The system 100 includes a first integrated circuit (IC) chip 110 and a second IC chip 160 coupled together as shown in FIG. 1. The second IC chip 160 is a memory chip, and the first IC chip 110 includes a memory controller 120 configured to manage memory access to the second IC chip 160. In an embodiment, various signals, such as command signals, data signals, and the like are transmitted between the first IC chip 110 and the second IC chip 160. The memory controller 120 is configured to adjust a ratio of transmission rates between command signals and data signals.

The system 100 can be any suitable system. In an embodiment, the system 100 is an electronic device, such as a desktop computer, a tablet computer, a smart phone, a wearable device, a network switch, a smart TV, a camera, a camcorder, a media player, and the like. The system 100 can include other suitable components that are not shown. In an example, the first IC chip 110 is a system-on-chip (SOC) that includes the memory controller 120 and other suitable circuits, such as a central processing unit (CPU), a graphics processing unit (GPU), analog circuits (not shown), radio frequency circuits (not shown), and the like. In an example, the first IC chip 110 is in a separate chip package from the second IC chip 160, and the two chip packages are mounted on a printed circuit board with other suitable circuit components. The two chip packages can be interconnected by printed copper wires for example.

In another embodiment, the system 100 is a chip package, such as a multi-chip module (MCM), and the like. The system 100 is a single package that includes the first IC chip 110 and the second IC chip 160 in the pre-packaged form, and includes interconnection components (e.g., metal wires) that interconnect the first IC chip 110 and the second IC chip 160.

The second IC chip 160 can be any suitable memory chip. In an embodiment, the second IC chip 160 is a dynamic random access memory (DRAM) type memory chip, such as double data rate synchronous DRAM (DDR SDRAM), low power DDR SDRAM (LPDDR SDRAM), and the like.

In the FIG. 1 example, the first IC chip 110 and the second IC chip 160 are coupled, for example, by wires that form buses, such as buses 101-104, and the like, to transmit various signals. For example, the bus 101 (e.g., a 1-bit bus line) is configured to transmit a clock signal CLK, the bus 102 (e.g., a m-bit bus line, m is a positive integer) is configured to transmit command signals CMD. The bus 103 (e.g., a x-bit bus line, x is a positive integer) is configured to transmit data signals DAT. The bus 104 (e.g., a 1-bit bus line) is configured to transmit a data strobe signal DQS, and the like. The first IC chip 110 and the second IC chip 160 include interface circuits to handle signals transmitted between the first IC chip 110 and the second IC chip 160.

Specifically, the first IC chip 110 includes interface circuits 125 configured to handle signals transmitted between the first IC chip 110 and the second IC chip 160. In the FIG. 1 example, the interface circuits 125 include a command processing circuit 121 configured to process commands (e.g., read commands, write commands, configuration commands, pre-charge commands . . . ). The commands are processed and provided to the second IC chip 160 to instruct the second IC chip 160 to operate accordingly. In an example, the command processing circuit 121 includes buffer circuits (not shown) configured to buffer, for example m bits for a command, and includes driver circuits (not shown) configured to drive the m bits for the command onto the bus 102 as the command signals CMD. The command processing circuit 121 can include other suitable circuits.

Generally, the command processing circuit 121 operates based on a command clock (CK) that is related to the clock signal CLK provided to the second IC chip 160 on the bus 101. In an example, the interface circuits 125 include a command clock generator circuit (not shown) configured to generate the command clock CK. In an example, the command clock CK is phase shifted and transmitted onto the bus 101 as the clock signal CLK. In another example, the command clock CK is transmitted onto the bus 101 as the clock signal CLK.

Further, in the FIG. 1 example, the interface circuits 125 include a data processing circuit 122 configured to process data. In an example of a write operation, the data processing circuit 122 includes buffer circuits (not shown) to buffer, for example x-bit data, for a data transmission, and includes driver circuits (not shown) to drive the x-bit data onto the bus 103. In an example of a read operation, the data processing circuit 122 includes sample and hold circuits (not shown) to sample the bus 103 and hold the sampled values.

Generally, the data processing circuit 122 operates based on a data clock (DK) that is related to the data strobe signal DQS on the bus 104. In an example of a write operation, the interface circuits 125 include a data clock generator circuit (not shown) configured to generate the data clock DK. For example, the data clock generator circuit is configured to generate the data clock DK based on the command clock CK with a configurable frequency ratio. Then, in an example, the data clock DK is phase shifted and transmitted onto the bus 104 as the data strobe signal DQS.

In an example of a read operation, the second IC chip 160 generates the data strobe signal DQS based on the received clock signal CLK and the ratio of transmissions between the command signals and the data signals, and drives the data strobe signal DQS onto the bus 104. Then, the interface circuits 125 include circuits to receive the data strobe signal DQS from the bus 104, and use the data strobe signal DQS to receive data from the bus 103.

According to an aspect of the disclosure, the memory controller 120 is configured to adjust a ratio of transmission rates between the command signals and the data signals. In an embodiment, the memory controller 120 is configured to adjust the ratio, such that the transmission rate for the command signals changes less significantly than the transmission rate for the data signals to relieve design efforts for the command processing circuits, such as the command processing circuit 121. In another embodiment, the memory controller 120 is configured to adjust the ratio, such that the transmission rate for the command signals is reduced while the transmission rate of the data signals remains to reduce power consumption by the command processing circuits, such as the command processing circuit 121.

In a related example, the ratio of transmission rates between the command signals and the data signals is fixed. In a DDR example, the clock signal CLK and the data strobe signal have the same frequency. The command signals are transmitted for example at rising edges of the command clock (e.g., the clock signal CLK), and the data signals are transmitted at both rising edges and falling edges of the data clock (e.g., the clock signal CLK is used as the data clock in an example). Thus, the ratio of transmission rates between the command signals and the data signals is fixed at 1:2. When the transmission rate for the data signals doubles, the transmission rate for the command signals also doubles in the related example.

In an embodiment according to the present disclosure, when the system 100 needs to double data bandwidth, the memory controller 120 is configured to double the transmission rate for the data signals. Further, the memory controller 120 lowers the ratio of transmission rates between command signals and data signals, such as to 1:4, thus the transmission rate for the command signals does not increase or does not change too much. In the embodiment, the frequency of the data clock doubles, and the frequency of the command clock is maintained without increase. Thus, the power consumption by the command processing circuits, such as the command processing circuit 121 can be lower than the related example. Also, when the frequency change of the command clock is relatively small, the command processing circuits, such as the command processing circuit 121 operate in a relatively more frequency-stable operation conditions, have less complex timing requirements. Thus, the command processing circuits can be designed with less effort, and can operate stably during operation.

In another embodiment according to the present disclosure, when the system 100 enters a power saving mode, the system 100 reduces the data bandwidth to save power. In an example, the memory controller 120 is configured to reduce the transmission rate for the data signals by half. Further, the memory controller 120 is configured to increase the ratio of transmission rates between the command signals and the data signals, such as from 1:2 to 1:1, thus the transmission rate for the command signals does not increase or does not change too much. In the embodiment, the frequency of the data clock reduces by half, and the frequency of the command clock is maintained without decrease. Thus, the power consumption by the data processing circuits, such as the data processing circuit 122 can be significantly reduced. Similarly, the frequency change of the command clock is relatively small, the command processing circuits, such as the command processing circuit 121 operate in a relatively more frequency-stable operation conditions, have less complex timing requirements. Thus, the command processing circuits can be designed with less effort, and can operate stably during operation.

According to an aspect of the disclosure, the memory controller 120 includes a ratio controller 130. In an example, the memory controller 120 is configured to determine a ratio change of transmission rates between the command signals and the data signals. In another example, the memory controller 120 is configured to receive information indicative of a ratio change of transmission rates between the command signals and the data signals. The ratio change is determined by other components, such as a central processing unit (CPU), and the like. Further, the ratio controller 130 is configured to coordinate the ratio change in the first IC chip 110 and the second IC chip 160 to have a smooth transition to the new ratio. For example, the ratio controller 130 is configured to control the interface circuits 125 to transmit information signals to the second IC chip 160 to inform the ratio change and allow the second IC chip 160 to change configuration accordingly. Further, the ratio controller 130 is configured to change configurations in the first IC chip 110 according to the ratio change. In an embodiment, the ratio controller 130 is configured to schedule a time to allow the interface circuits 125 to start transmitting/receiving signals according to the new ratio. In another embodiment, the time to start transmitting/receiving signals according to the new ratio is scheduled by other suitable circuit component, such as a central processing unit (CPU), and the like.

According to the disclosure, the ratio controller 130 or other circuit component (e.g., CPU) can determine the ratio change under various situations. In an example, when an instruction to change the data bandwidth (e.g., double the bandwidth, reduce the bandwidth by half . . . ) is received, the ratio controller 130 or other circuit component (e.g., CPU) determines to change the ratio of transmission rates between the command signals and the data signals. In another example, when an instruction to change a power mode (e.g., enter a power saving mode, exit a power saving mode . . . ) is received, the ratio controller 130 or other circuit component (e.g., CPU) determines to change the ratio of transmission rates between the command signals and the data signals.

Further, in the FIG. 1 example, the ratio controller 130 includes a timing controller 140 and a command encoder 150. The command encoder 150 is configured to control the interface circuits 125 to inform the ratio change to the second IC chip 160. In an embodiment, the timing controller 140 is configured to change clock configurations for the first IC chip 110 and schedule the time to start transmitting/receiving according to the new ratio. In another embodiment, the timing controller 140 receives timing information to start transmitting/receiving according to the new ratio from other suitable circuit component, such as the CPU and the like The command encoder 150 can use any suitable technique to control the interface circuits 125 to inform the ratio change to the second IC chip 160. In an example, the command encoder 150 is configured to encode the ratio change in an m-bit command. The m-bit command is indicative of the new ratio. Then the interface circuits 125 can drive the m-bit command on to the bus 102 for transmission to the second IC chip 160. The second IC chip 160 can decode the m-bit command, and can change configuration accordingly.

In another example, the command encoder 150 is configured to encode the ratio change in the characteristics of a specific signal, such as the clock signal CLK and the like, and control the interface circuits 125 to drive the specific signal to the second IC chip 160. For example, the command encoder 150 is configured to disable transitions in the clock signal CLK to stop the clock signal CLK in order to indicate the ratio change. In an example, two ratios are used in the system 100. To switch from one ratio to another ratio, the command encoder 150 stops the clock signal CLK for a time duration and then starts the clock signal CLK. The second IC chip 160 can detect the clock signal CLK on the bus 101. When the second IC chip 160 detects a stop of the clock signal CLK, the second IC chip 160 can switch its configuration to a different ratio from the current ratio.

In another example, the command encoder 150 is configured to encode the ratio change in a frequency change of the clock signal CLK. In an example, two ratios are used in the system 100. To switch from one ratio to another ratio, the command encoder 150 changes a frequency of the clock signal CLK. In an example, the command encoder 150 is configured to change a configuration of a command clock generator circuit to change the frequency of the clock signal CLK.

The second IC chip 160 can detect the frequency change in the clock signal CLK on the bus 101. When the second IC chip 160 detects a frequency change of the clock signal CLK, the second IC chip 160 can switch its configuration to a different ratio from the current ratio.

In the FIG. 1 example, the timing controller 140 includes a command clock controller 141 and a data clock controller 142. The command clock controller 141 is configured to control configurations to generate clocks used for command processing, such as the command clock CK used by the command processing circuit 121. The data clock controller 142 is configured to control configurations to generate clocks used for data processing, such as the data clock DK used by the data processing circuit 122 during write operations.

In an embodiment, the command clock CK is generated based on a system clock (e.g., a clock used by the CPU) according to a command clock configuration by the command clock generator circuit for example. The data clock DK can be generated by the data clock generator circuit based on the system clock or can be generated by the data clock generator circuit based on the command clock CK according to a data clock configuration.

In an embodiment, the command clock configuration is controlled to adjust a first frequency ratio between the system clock and the command clock, and the data clock configuration is controlled to adjust a second frequency ratio between the system clock and the data clock. The command clock controller 141 is configured to control the command clock configuration to adjust the first frequency ratio and the data clock controller 142 is configured to control the data clock configuration to adjust the second frequency ratio.

In an example, when the ratio controller 130 or other circuit component (e.g., CPU) determines to reduce the ratio of transmission rates (e.g., from 1:2 to 1:4) between the command signals and the data signals in response to doubling the data bandwidth (without a change of the system clock), the data clock controller 142 is configured to control the data clock configuration to double the frequency of the data clock, and the command clock controller 141 is configured not to change the command clock configuration.

In another example, when the ratio controller 120 or other circuit component (e.g., CPU) determines to increase the ratio of transmission rates (e.g., from 1:2 to 1:1) between the command signals and the data signals in response to entering a power saving mode (e.g., reducing frequency of the system clock by half), the command clock controller 141 is configured to change the command clock configuration to maintain the frequency of the command clock under the reduced system clock, and the data clock controller 142 is configured not to change the data clock configuration to reduce the data clock frequency with the system clock.

In another embodiment, the data clock DK is generated based on the command clock CK. For example, the command clock configuration is controlled to adjust a first frequency ratio between the system clock and the command clock, and the data clock configuration is controlled to adjust a second frequency ratio between the command clock CK and the data clock DK. The command clock controller 141 is configured to control the command clock configuration to adjust the first frequency ratio and the data clock controller 142 is configured to control the data clock configuration to adjust the second frequency ratio.

In an example, when the ratio controller 130 (or other circuit component, such as the CPU) determines to reduce the ratio of transmission rates (e.g., from 1:2 to 1:4) between the command signals and the data signals in response to doubling the data bandwidth (without a change of the system clock), the data clock controller 142 is configured to control the data clock configuration to reduce the second frequency ratio (e.g., from 1:1 to 1:2), and the command clock controller 141 is configured not to change the command clock configuration.

In another example, when the ratio controller 130 (or other circuit component, such as the CPU) determines to increase the ratio of transmission rates (e.g., from 1:2 to 1:1) between the command signals and the data signals in response to entering a power saving mode (e.g., reducing frequency of the system clock by half), the command clock controller 141 is configured to change the command clock configuration to maintain the frequency of the command clock under the reduced system clock, and the data clock controller 142 is configured to increase the second frequency ratio (e.g., from 1:1 to 1:½).

According to an aspect of the disclosure, the timing controller 140 also includes a timer circuit (not shown) configured to setup a time to start transmissions based on the new ratio.

According to an aspect of the disclosure, the second IC chip 160 is configured to operate with the memory controller 120. In an embodiment, the second IC chip 160 includes a ratio controller 170. For example, the ratio controller 170 includes a command decoder 180 configured to decode the ratio change information encoded by the command encoder 150.

Further, in the FIG. 1 example, the ratio controller 170 includes a DQS generator circuit 191 configured to generate the data strobe signal DQS for read operations based on the clock signal CLK with a configurable ratio. Further, the ratio controller 170 includes a data clock controller 192 configured to adjust the configurable ratio based on the ratio change information.

In an example, when the command decoder 180 decodes the ratio change information, the data clock controller 192 can control the configuration of the DQS generator circuit 191 to generate the data strobe signal DQS for read operation accordingly.

In an example, when the ratio change information indicates a reduction of the ratio of transmission rates (e.g., from 1:2 to 1:4) between the command signals and the data signals, the data clock controller 192 is configured to control the configuration of the DQS generator circuit 191 to reduce the frequency ratio (e.g., from 1:1 to 1:2).

In another example, when the ratio change information indicates an increase the ratio of transmission rates (e.g., from 1:2 to 1:1) between the command signals and the data signals, the data clock controller 192 is configured to control the configuration of the DQS generator circuit 191 to increase the second frequency ratio (e.g., from 1:1 to 1:½).

Figure 2:
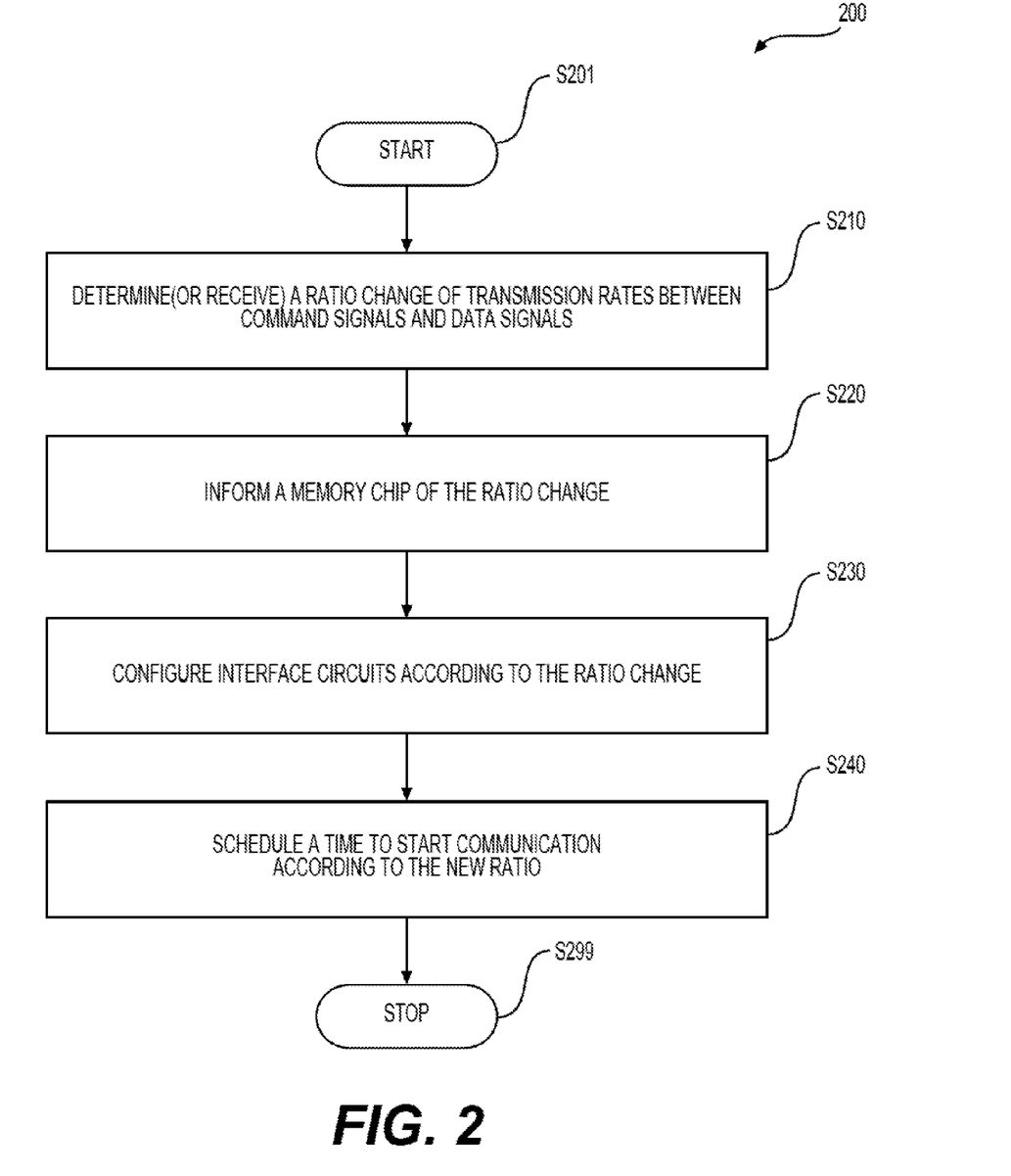
FIG. 2 shows a flow chart outlining a process 200 according to an embodiment of the disclosure.

FIG. 2 shows a flow chart outlining a process 200 according to an embodiment of the disclosure. In the example, the process 200 is executed by the memory controller 120 in the FIG. 1 example. The process starts at S201 and proceeds to S210.

At S210, a ratio change of transmission rates between the command signals and the data signals are determined or received. In an example, the ratio controller 130 determines the ratio change in response to an instruction to change the data bandwidth (e.g., double the bandwidth, reduce the bandwidth by half . . . ). In another example, the ratio controller 130 determines the ratio change in response to an instruction to change a power mode. In another example, a suitable circuit component (e.g., the CPU) determines the ratio change in response to the instruction to change the data bandwidth or change a power mode, and provides information indicative of the ratio change to the ratio controller 130. The ratio controller 130 receives the information indicative of the ratio change.

At S220, a memory chip is informed of the ratio change. In an example, the command encoder 150 is configured to encode the ratio change in an m-bit command to be transmitted to the memory chip. In another example, the command encoder 150 is configured to cause a stop in the clock signal CLK in order to indicate the ratio change. In another example, the command encoder 150 is configured to cause a frequency change of the clock signal CLK.

At S230, interface circuits are configured according to the ratio change. In an example, the data clock configuration for the data clock generator circuit in the interface circuits 125 is changed according to the ratio change. In another example, the command clock configuration for the command clock generator circuit in the interface circuits 125 is changed according to the ratio change.

At S240, a time to start communication according to the new ratio is scheduled. In an example, a timer with a preset value is started. The preset value is pre-determined to allow the first IC chip 110 and the second IC chip 160 to have enough time to settle to the new configurations. When the timer expires, the memory controller 120 sends a new command to start communication according to the new ratio. In an example, the time to start communication according to the new ratio is scheduled by the memory controller 120. In another example, the time to start communication according to the new ratio is scheduled by other suitable circuit component, such as the CPU. Then the process proceeds to S299 and terminates.

Figure 3:
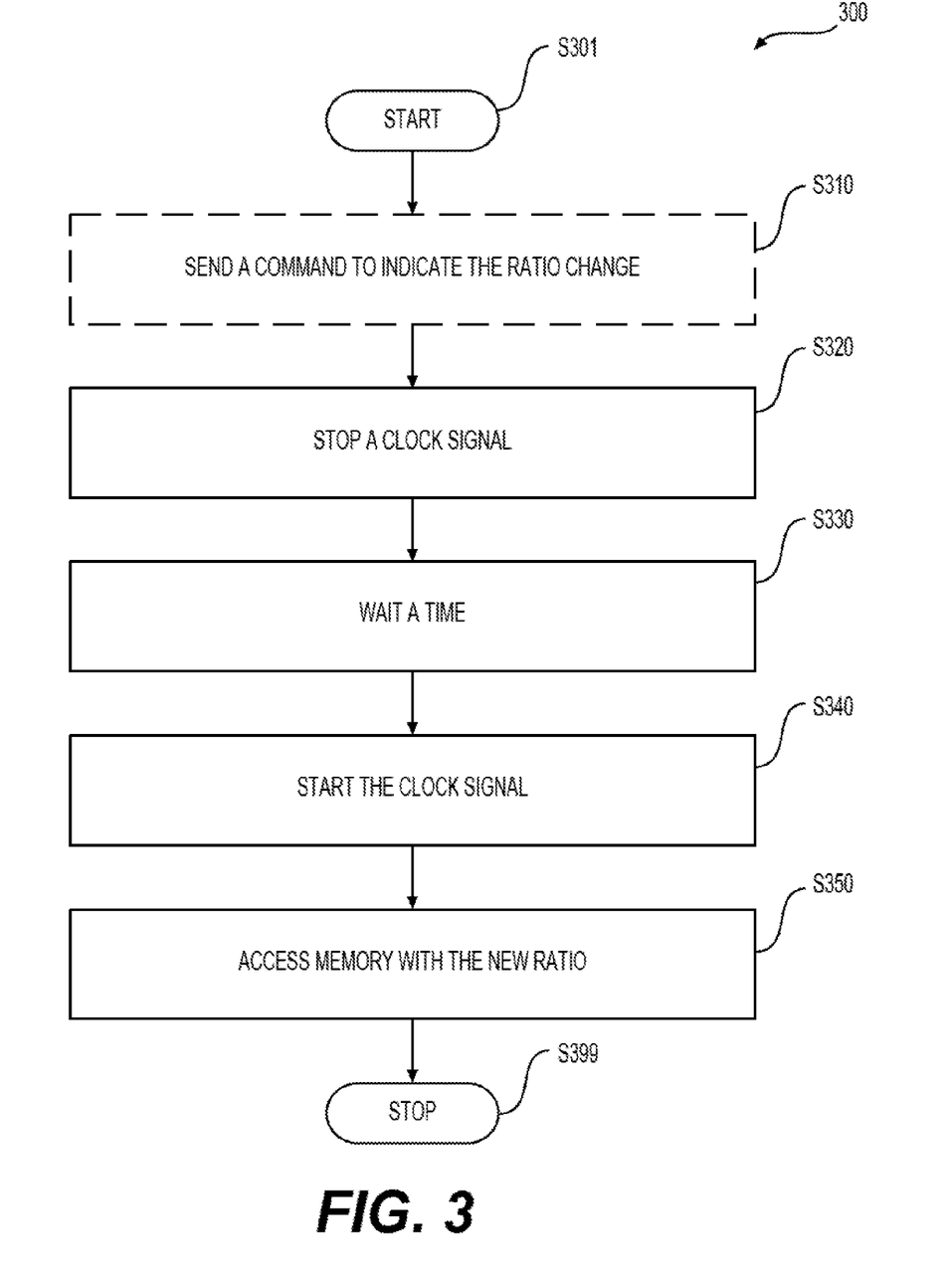
FIG. 3 shows a flow chart outlining a process 300 according to an embodiment of the disclosure.

FIG. 3 shows a flow chart outlining a process 300 according to an embodiment of the disclosure. In the example, the process 300 is executed by the memory controller 120 in the FIG. 1 example. The process starts at S301 and proceeds to S310.

At S310, a command to indicate a ratio change is sent to a memory chip. In an example, the command encoder 150 is configured to encode the ratio change in an m-bit command. Then, the m-bit command is transmitted onto the bus 102 to the memory chip. In an example, the step S310 can be skipped.

At S320, a clock signal CLK is controlled to stop. In an example, the command encoder 150 is configured to cause a stop in the clock signal CLK. In an example, the stop in the clock signal CLK indicates a ratio change. For example, in a two-ratio scenario, the stop in the clock signal CLK indicates a change to a different ratio from the current ratio.

At S330, a timer is started to assist, for example the system 100, to wait for a time. In an example, a timer with a preset value is started. The preset value is pre-determined to allow the first IC chip 110 and the second IC chip 160 to have enough time to settle to the new configurations. When the timer expires, the process proceeds to S340.

At S340, the clock signal CLK is restarted. In an example, the command encoder 150 is configured to cause the clock signal CLK to restart.

At S350, the memory chip is accessed with the new ratio. In an example, the memory controller 120 sends a command to the second IC chip 160 to start the memory access with the new ratio. Then the process proceeds to S399 and terminates.

Figure 4:
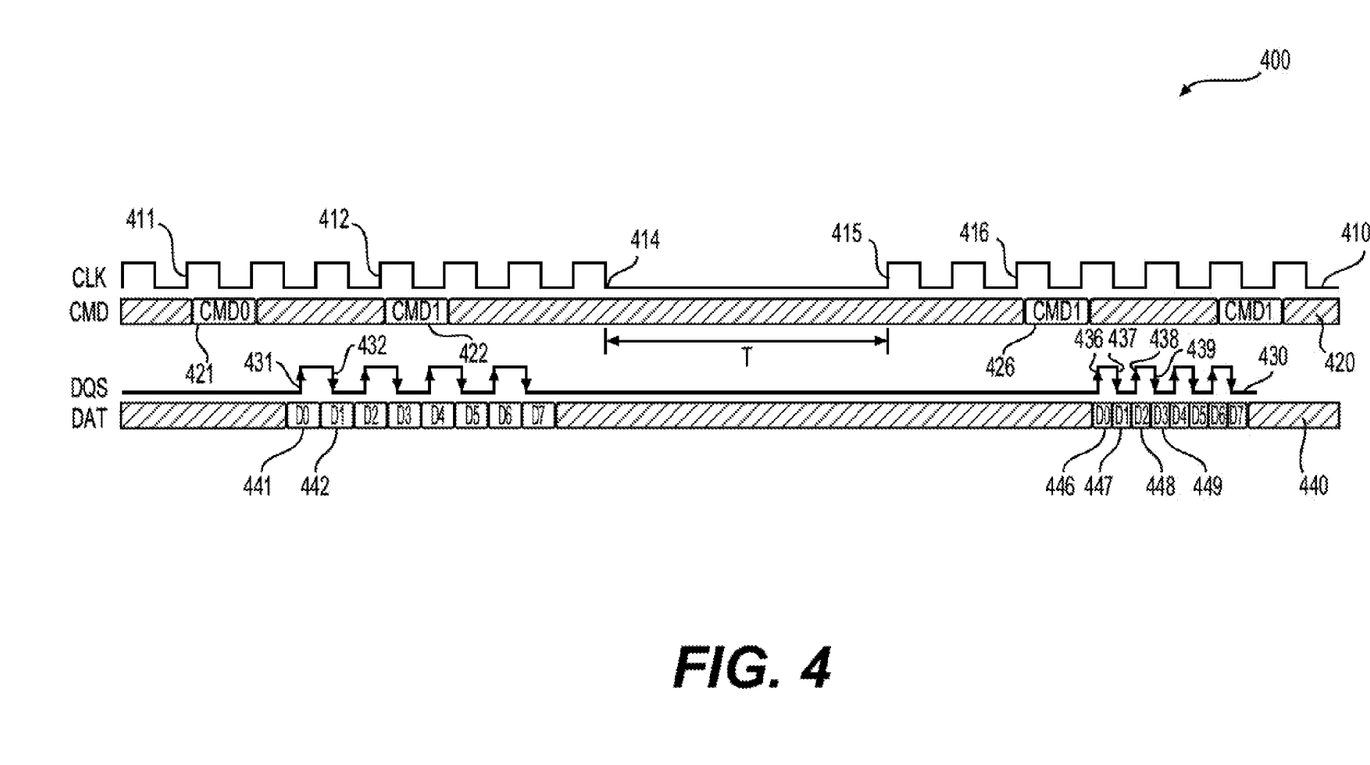
FIG. 4 shows a plot of waveforms according to an embodiment of the disclosure.

FIG. 4 shows a plot 400 of signal waveforms on the buses 101-104 according to the process 300. The plot 400 includes a first waveform 410 for the clock signal CLK on the bus 101, a second waveform 420 for the command signals CMD on the bus 102, a third waveform 430 for the data strobe signal DQS on the bus 104, and a fourth waveform 440 for the data signals DAT on the bus 103.

In the FIG. 4 example, initially, the transmission ratio between the command signals CMD and the data signals DAT is 1:2. For example, the frequency of the clock signal CLK and the frequency of a data clock (e.g., the data strobe signal DQS is a phase shifted version of the data clock) are the same. For the command signals CMD, the driving circuits in the interface circuits 125 are configured to drive the command signals CMD onto the bus 102 in response to rising edges of the clock signal CLK, and hold the command signals for a clock cycle of the clock signal CLK, as shown by 411 and 421. Thus, the command transmission rate is the same as the frequency of the clock signal CLK.

It is noted that, in an example, at the second IC chip 160, the clock signal CLK is used to sample the command signals CMD for example at falling edges of the clock signal CLK.

For write operations, the driving circuits in the interface circuits 125 are configured to drive the data signals DAT onto the bus 103 in response to both rising edges and falling edges of the data clock, and hold the data signals DAT for half clock cycle of the data clock, as shown by 441. Thus, the data transmission rate doubles the frequency of the data clock. Thus, the transmission ratio between the command signals CMD and the data signals DAT is 1:2.

For the write operations, the first IC chip 110 generates the DQS signal and drives the DQS signal on the bus 104. At the second IC chip 160, the data strobe signal DQS is used to sample the data signals DAT on the bus 103 at both rising edges and falling edges of the data strobe signal DQS.

For read operations, in an example, the second IC chip 160 receives the clock signal CLK, and the second IC chip 160 is configured to generate a data clock based on the clock signal CLK, and generate the data strobe signal DQS as a phase-shifted version of the data clock. Initially, the data clock is the same as the clock signal CLK, the second IC chip 160 then drives the data signals DAT onto the bus 103 in response to both rising edges and falling edges of the data clock, and hold the data signals DAT for half clock cycle of the data clock, as shown by 441. Thus, the data transmission rate doubles the frequency of the clock signal CLK. For the read operations, the second IC chip 160 drives the data strobe signal DQS onto the bus 104. At the first IC chip 110, the data strobe signal DQS is used to sample the data signals DAT on the bus 103 at both rising edges and falling edges of the data strobe signal DQS.

In an embodiment, a command 422 is sent from the first IC chip 110 to the second IC chip 160 to indicate a ratio change to 1:4.

In another embodiment, the clock signal CLK is caused to stop, as shown by 414 to indicate a ratio change for example to 1:4.

In the FIG. 4 example, the memory controller 120 waits for a time T. In an example, a timer with a preset value is started. The preset value is pre-determined corresponding to the time T to allow the first IC chip 110 and the second IC chip 160 to have enough time to settle to the new configurations.

For example, on the first IC chip 110, the data clock controller 142 controls the data clock configuration to reduce the second frequency ratio (e.g., from 1:1 to 1:2), thus the frequency of the data clock and the DQS signal doubles. On the second IC chip 120, the data clock controller controls the configuration of the DQS generator circuit 191 to reduce the frequency ratio (e.g., from 1:1 to 1:2), thus the frequency of the data clock and the DQS signal doubles.

In an example, when the timer expires, the command encoder 150 is configured to cause the clock signal CLK to restart as shown by 415 to start communication according to the new ratio 1:4.

For example, the frequency of the clock signal CLK remains the same as in the initial situation. Thus, the command transmission rate is the same as in the initial situation.

Further, the data clock and the data strobe signal DQS have doubled the frequency, thus data transmission rate is doubled. Then, the ratio of transmission rates between the command signals and the data signals is 1:4.

Figure 5:
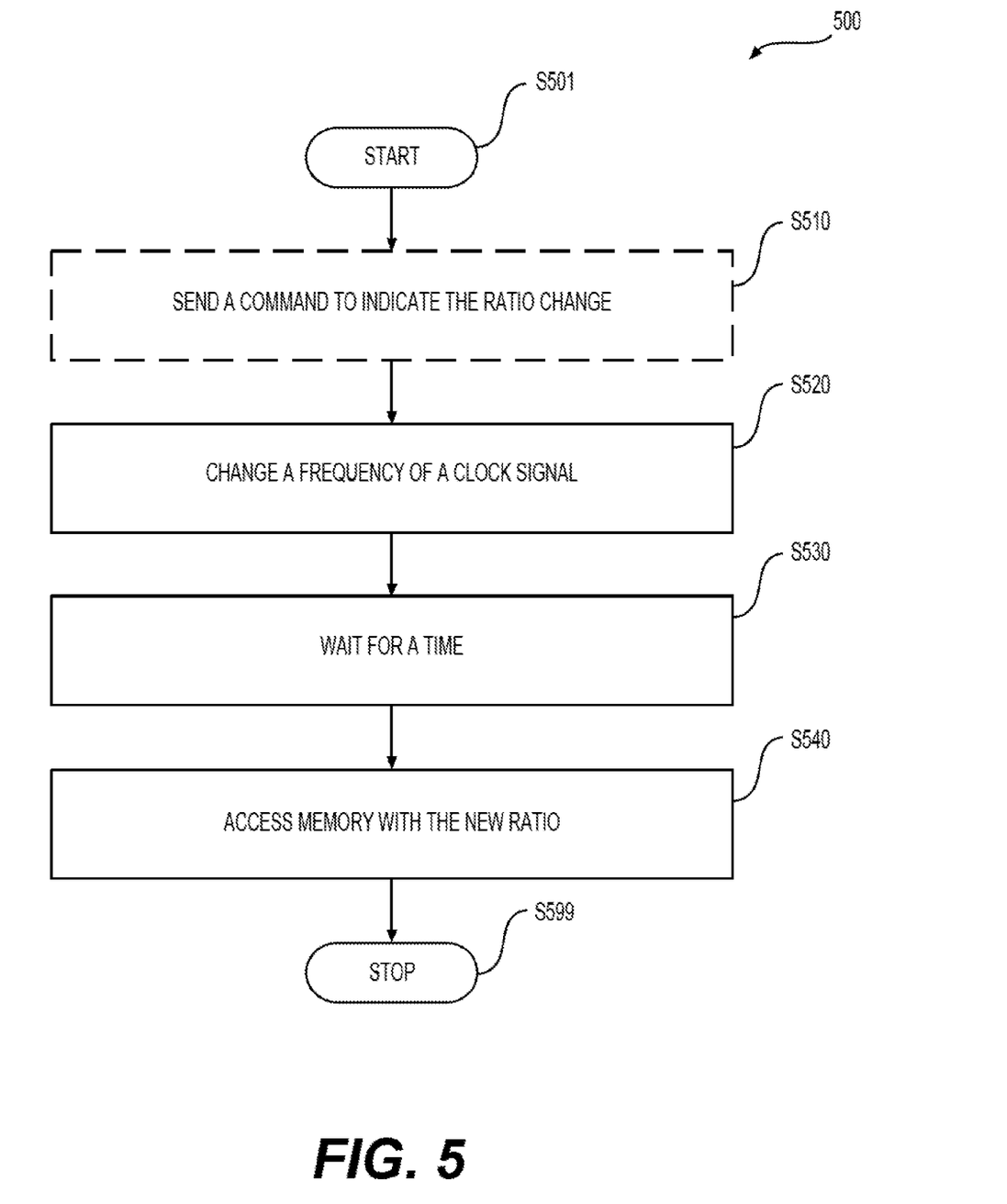
FIG. 5 shows a flow chart outlining a process 500 according to an embodiment of the disclosure.

FIG. 5 shows a flow chart outlining a process example according to an embodiment of the disclosure. In an example, the process 500 is executed by the memory controller 120 in the FIG. 1 example. The process starts at S501 and proceeds to S510.

At S510, a command to indicate a ratio change is sent to a memory chip. In an example, the command encoder 150 is configured to encode the ratio change in an m-bit command. Then, the m-bit command is transmitted onto the bus 102 to the memory chip. In an example, the step S510 can be skipped.

At S520, a clock signal CLK is controlled to have a frequency change. In an example, the command encoder 150 is configured to change a configuration of the command clock generator circuit in the interface circuits 125 to cause the frequency change in the clock signal CLK. In an example, the frequency change in the clock signal CLK indicates a ratio change. For example, in a two-ratio scenario, the frequency change in clock signal CLK indicates a change to a different ratio from the current ratio.

At S530, a timer is started to wait for a time. In an example, a timer with a preset value is started. The preset value is pre-determined to allow the first IC chip 110 and the second IC chip 160 to have enough time to settle to the new configurations. When the timer expires, the process proceeds to S540.

At S540, the memory chip is accessed with the new ratio for the transmission rate between the command signals and the data signals. In an example, the memory controller 120 sends a command to the second IC chip 160 to start the memory access with the new ratio. Then the process proceeds to S599 and terminates.

Figure 6:
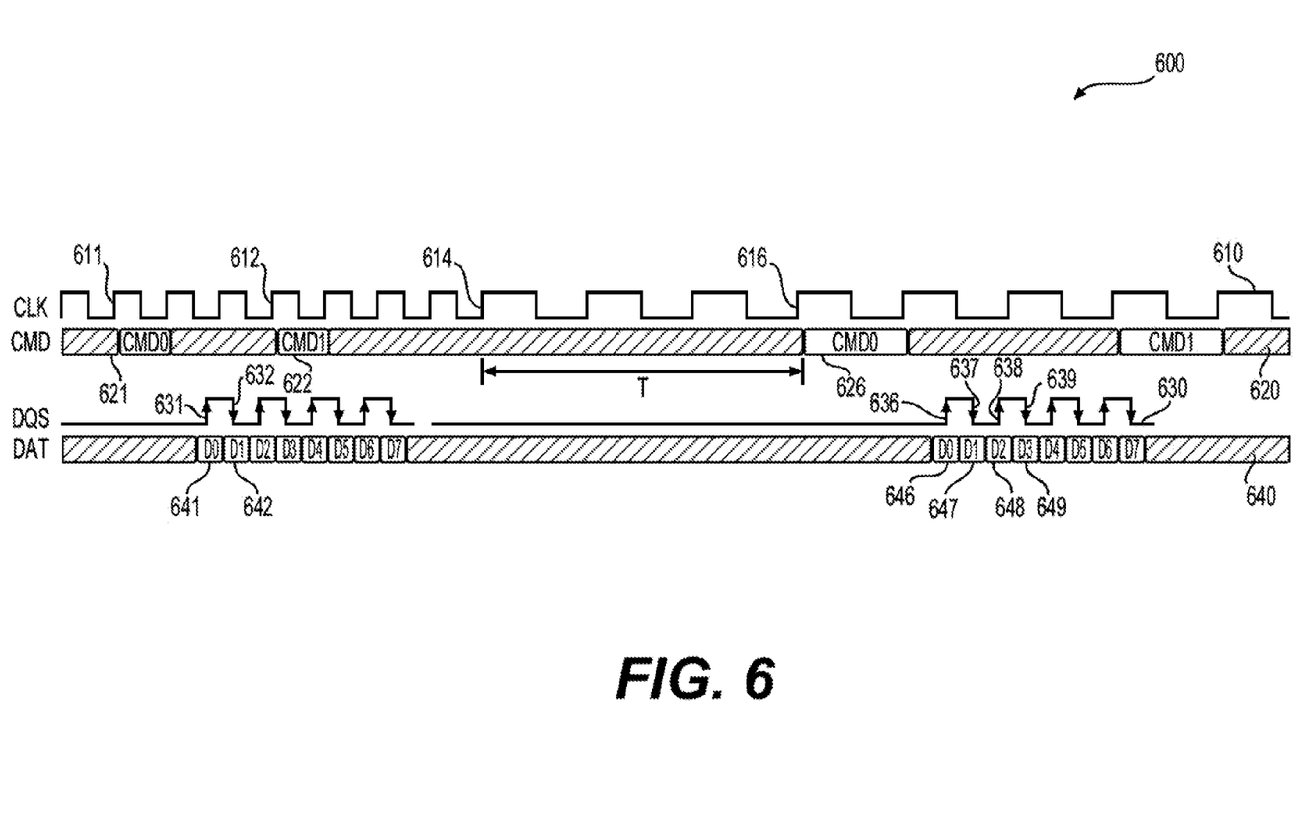
FIG. 6 shows a plot of waveforms according to an embodiment of the disclosure.

FIG. 6 shows a plot 600 of signal waveforms on the buses 101-104 according to the process 500. The plot 600 includes a first waveform 610 for the clock signal CLK on the bus 101, a second waveform 620 for the command signals CMD on the bus 102, a third waveform 630 for the data strobe signal DQS on the bus 104, and a fourth waveform 640 for the data signals DAT on the bus 103.

In the FIG. 6 example, initially, the transmission ratio between the command signals CMD and the data signals DAT is 1:2. For example, the frequency of the clock signal CLK and the frequency of a data clock (e.g., the data strobe signal DQS is a phase shifted version of the data clock) are the same. For the command signals CMD, the driving circuits in the interface circuits 125 are configured to drive the command signals CMD onto the bus 102 in response to rising edges of the clock signal CLK, and hold the command signals for a clock cycle of the clock signal CLK, as shown by 611 and 621. Thus, the command transmission rate is the same as the frequency of the clock signal CLK.

For write operations, the driving circuits in the interface circuits 125 are configured to drive the data signals DAT onto the bus 103 in response to both rising edges and falling edges of the data clock, and hold the data signals DAT for half clock cycle of the data clock, as shown by 641. Thus, the data transmission rate doubles the frequency of the data clock. Thus, the transmission ratio between the command signals CMD and the data signals DAT is 1:2.

For the write operations, the first IC chip 110 generates the DQS signal and drives the DQS signal on the bus 104. At the second IC chip 160, the data strobe signal DQS is used to sample the data signals DAT on the bus 103 at both rising edges and falling edges of the data strobe signal DQS.

For read operations, in an example, the second IC chip 160 receives the clock signal CLK, and the second IC chip 160 is configured to generate a data clock based on the clock signal CLK, and generate the data strobe signal DQS as a phase-shifted version of the data clock. Initially, the data clock is the same as the clock signal CLK, the second IC chip 160 then drives the data signals DAT onto the bus 103 in response to both rising edges and falling edges of the data clock, and hold the data signals DAT for half clock cycle of the data clock, as shown by 641. Thus, the data transmission rate doubles the frequency of the clock signal CLK. For the read operations, the second IC chip 160 drives the data strobe signal DQS onto the bus 104. At the first IC chip 110, the data strobe signal DQS is used to sample the data signals DAT on the bus 103 at both rising edges and falling edges of the data strobe signal DQS.

In an embodiment, a command 622 is sent from the first IC chip 110 to the second IC chip 160 to indicate a ratio change to 1:4.

In another embodiment, the clock signal CLK is caused to have a frequency change (e.g., a frequency reduction by half), as shown by 614 to indicate a ratio change for example to 1:4.

In the FIG. 6 example, the memory controller 120 waits for a time T. In an example, a timer with a preset value is started. The preset value is pre-determined corresponding to the time T to allow the first IC chip 110 and the second IC chip 160 to have enough time to settle to the new configurations.

For example, on the first IC chip 110, the data clock controller 142 controls the data clock configuration to reduce (e.g., from 1:1 to 1:2) the second frequency ratio which is the frequency ratio between the command clock to the data clock (or the data strobe signal DQS), thus the frequency of the data clock is twice the frequency of the command clock (e.g., the clock signal CLK). Because the frequency of the clock signal CLK is reduced by half thus the frequency of the data clock and the DQS signal remains the same as in the initial situation.

On the second IC chip 120, the data clock controller 192 controls the configuration of the DQS generator circuit 191 to reduce (e.g., from 1:1 to 1:2) the frequency ratio that is the frequency ratio between the clock signal CLK and the data clock (or the data strobe clock DQS), thus the frequency of the data clock is twice the frequency of the command clock (e.g., the clock signal CLK). Because the frequency of the clock signal CLK is reduced by half, the frequency of the data clock and the data strobe signal DQS remains the same as in the initial situation.

In an example, when the timer expires, the memory controller 120 is configured to send a command as shown by 626 to start communication according to the new ratio 1:4.

For example, the frequency of the clock signal CLK is reduced by half compared to the initial situation. Thus, the command transmission rate is half of the command transmission rate in the initial situation.

Because the frequency of the data clock and the data strobe signal DQS does not change from the initial situation, the data transmission rate is the same as in the initial situation. Thus, the ratio of transmission rates between the command signals and the data signals is 1:4.

Figure 7:
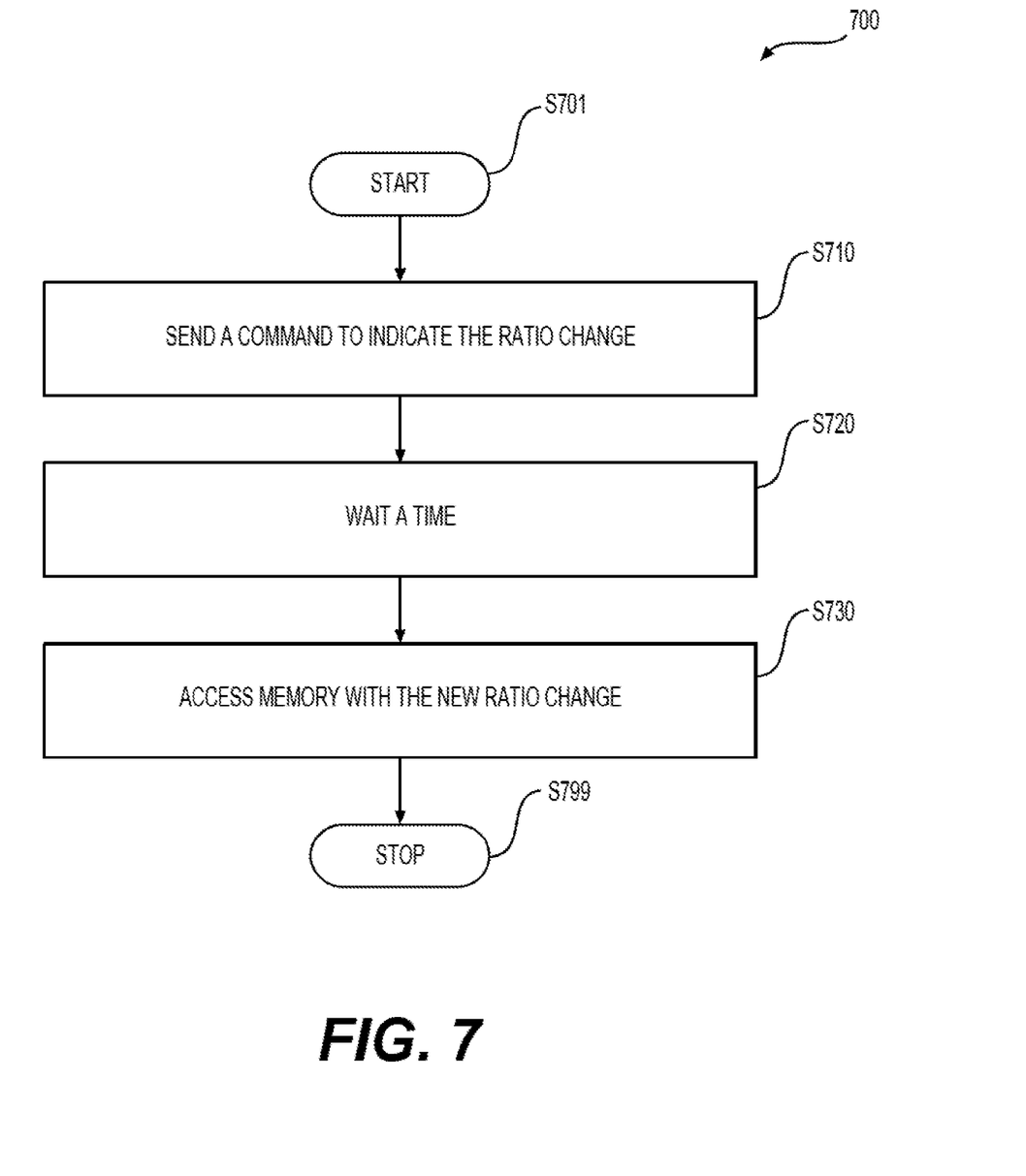
FIG. 7 shows a flow chart outlining a process 700 according to an embodiment of the disclosure.

FIG. 7 shows a flow chart outlining a process 700 according to an embodiment of the disclosure. In an example, the process 700 is executed by the memory controller 120 in the FIG. 1 example. The process starts at S701 and proceeds to S710.

At S710, a command to indicate a ratio change is sent to a memory chip. In an example, the command encoder 150 is configured to encode the ratio change in an m-bit command. Then, the m-bit command is transmitted onto the bus 102 to the memory chip.

At S720, a timer is started to wait for a time. In an example, a timer with a preset value is started. The preset value is pre-determined to allow the first IC chip 110 and the second IC chip 160 to have enough time to settle to new configurations. When the timer expires, the process proceeds to S730.

At S730, the memory chip is accessed with the new ratio. In an example, the memory controller 120 sends a command to the second IC chip 160 to start the memory access with the new ratio. Then the process proceeds to S799 and terminates.

Figure 8:
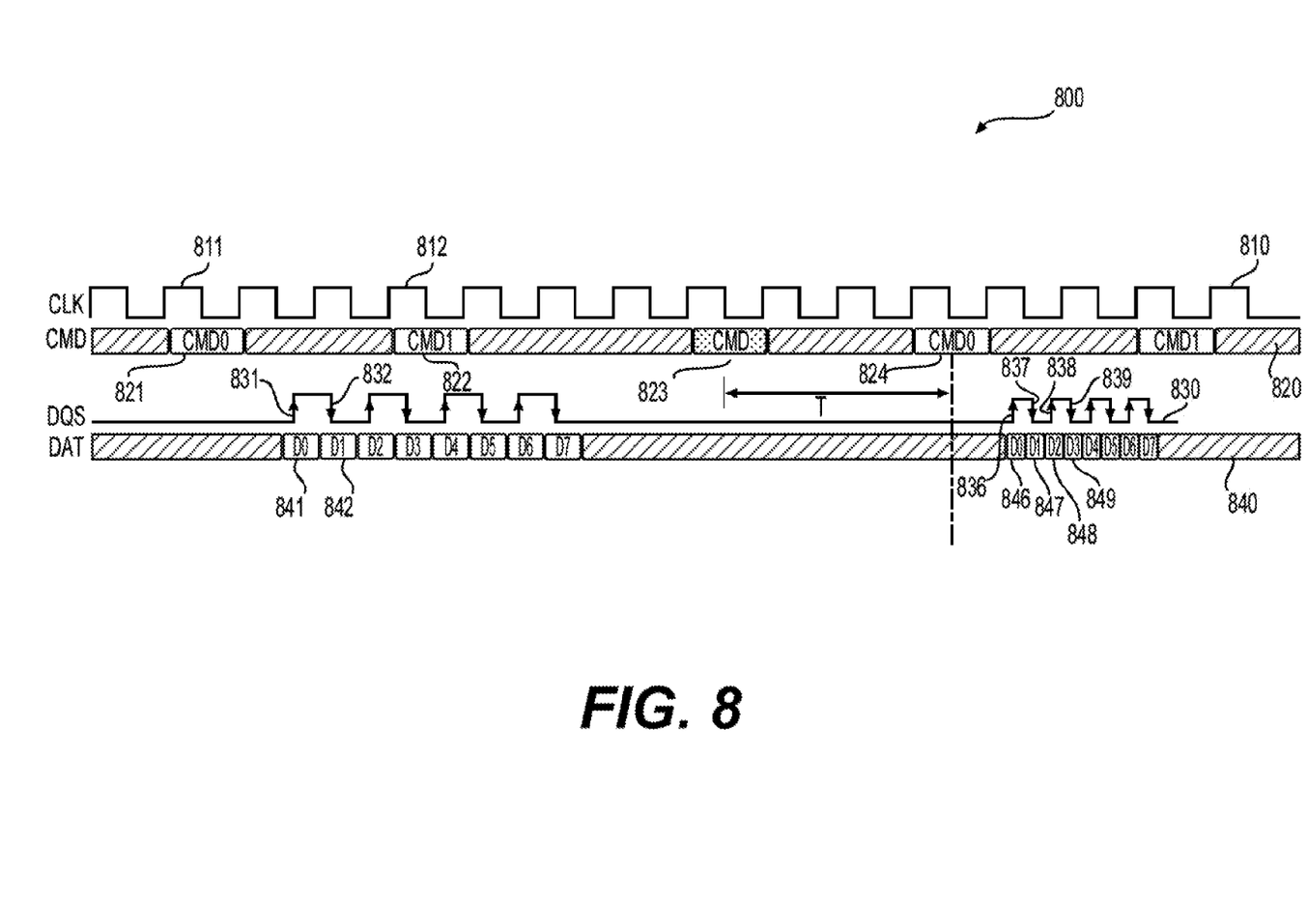
FIG. 8 shows a plot of waveforms according to an embodiment of the disclosure.

FIG. 8 shows a plot 800 of signal waveforms on the buses 101-104 according to the process 700. The plot 800 includes a first waveform 810 for the clock signal CLK on the bus 101, a second waveform 820 for the command signals CMD on the bus 102, a third waveform 830 for the data strobe signal DQS on the bus 104, and a fourth waveform 840 for the data signals DAT on the bus 103.

In the FIG. 8 example, initially, the transmission ratio between the command signals CMD and the data signals DAT is 1:2. For example, the frequency of the clock signal CLK and the frequency of a data clock (e.g., the data strobe signal DQS is a phase shifted version of the data clock) are the same. For the command signals CMD, the driving circuits in the interface circuits 125 are configured to drive the command signals CMD onto the bus 102 in response to rising edges of the clock signal CLK, and hold the command signals for a clock cycle of the clock signal CLK, as shown by 811 and 821. Thus, the command transmission rate is the same as the frequency of the clock signal CLK.

For write operations, the driving circuits in the interface circuits 125 are configured to drive the data signals DAT onto the bus 103 in response to both rising edges and falling edges of the data clock, and hold the data signals DAT for half clock cycle of the data clock, as shown by 841. Thus, the data transmission rate doubles the frequency of the data clock. Thus, the transmission ratio between the command signals CMD and the data signals DAT is 1:2.

For the write operations, the first IC chip 110 generates the DQS signal and drives the DQS signal on the bus 104. At the second IC chip 160, the data strobe signal DQS is used to sample the data signals DAT on the bus 103 at both rising edges and falling edges of the data strobe signal DQS.

For read operations, in an example, the second IC chip 160 receives the clock signal CLK, and the second IC chip 160 is configured to generate a data clock based on the clock signal CLK, and generate the data strobe signal DQS as a phase-shifted version of the data clock. Initially, the data clock is the same as the clock signal CLK, the second IC chip 160 then drives the data signals DAT onto the bus 103 in response to both rising edges and falling edges of the data clock, and hold the data signals DAT for half clock cycle of the data clock, as shown by 841. Thus, the data transmission rate doubles the frequency of the clock signal CLK. For the read operations, the second IC chip 160 drives the data strobe signal DQS onto the bus 104. At the first IC chip 110, the data strobe signal DQS is used to sample the data signals DAT on the bus 103 at both rising edges and falling edges of the data strobe signal DQS.

In an embodiment, a command 823 is sent from the first IC chip 110 to the second IC chip 160 to indicate a ratio change to 1:4.

In the FIG. 8 example, the memory controller 120 waits for a time T. In an example, a timer with a preset value is started. The preset value is pre-determined corresponding to the time T to allow the first IC chip 110 and the second IC chip 160 to have enough time to settle to the new configurations.

For example, on the first IC chip 110, the data clock controller 142 controls the data clock configuration to reduce the second frequency ratio (e.g., from 1:1 to 1:2), thus the frequency of a data clock and the DQS signal doubles. On the second IC chip 120, the data clock controller controls the configuration of the DQS generator circuit 191 to reduce the frequency ratio (e.g., from 1:1 to 1:2), thus the frequency of a data clock and the DQS signal doubles.

In an example, when the timer expires, the memory controller 120 sends a command as shown by 824 to start communication according to the new ratio 1:4.

For example, the frequency of the clock signal CLK remains the same as in the initial situation. Thus, the command transmission rate is the same as in the initial situation.

Further, the data clock and the data strobe signal DQS have doubled the frequency, thus data transmission rate is doubled. Then, the ratio of transmission rates between the command signals and the data signals is 1:4.

When implemented in hardware, the hardware may comprise one or more of discrete components, an integrated circuit, an application-specific integrated circuit (ASIC), etc.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An integrated circuit (IC) chip, comprising:
   interface circuits configured to interface the IC chip to buses that couple the IC chip with a memory chip, drive signals to the buses for transmission to the memory chip, and receive signals that are transmitted on the buses from the memory chip; and a control circuit configured to, in response to an instruction to change a data bandwidth on a data bus of the buses, control the interface circuits to transmit information signals to the memory chip to inform an updated ratio of an updated transmission rate for a command bus of the buses to an updated transmission rate for the data bus of the buses, and configure the interface circuits according to the updated ratio and control the interface circuits to transmit/receive signals on the buses according to the updated ratio.

2. The IC chip of claim 1, wherein the control circuit is configured to control the interface circuits to transmit command signals using the command bus to the memory chip to inform the updated ratio.

3. The IC chip of claim 1, wherein the control circuit is configured to control the interface circuits to change a characteristic of a clock signal to the memory chip to indicate the updated ratio.

4. The IC chip of claim 3, wherein the control circuit is configured to cause the clock signal to stop to indicate selecting another predetermined ratio as the updated ratio.

5. The IC chip of claim 4, wherein the control circuit is configured to cause the clock signal to restart after a period of time to allow the interface circuits to transmit/receive signals according to the updated ratio.

6. The IC chip of claim 3, wherein the control circuit is configured to control the interface circuits to cause a frequency change of the clock signal to indicate the updated ratio.

7. The IC chip of claim 6, wherein the control circuit is configured to control the interface circuits to transmit command signals using the command bus after the frequency change to allow the interface circuits to transmit/receive signals according to the updated ratio.

8. The IC chip of claim 1, further comprising:

a data strobe generation circuit configured to generate a data strobe signal based on a clock signal with a configurable ratio, wherein the control circuit is configured to change the configurable ratio according to the updated ratio.

9. The IC chip of claim 1, wherein the control circuit is configured to set the updated ratio in a manner that a relative change between the updated transmission rate for the command bus and a previous transmission rate for the command bus is less than a relative change between the updated transmission rate for the data bus and a previous transmission rate for the data bus.

10. The IC chip of claim 1, wherein the control circuit is configured to set the updated ratio to maintain a previous transmission rate for the command bus as the updated transmission rate for the command bus.

11. An apparatus, comprising:

a first integrated (IC) chip;

a second IC chip that is a memory IC chip; and interconnection components configured to form buses to interconnect the first chip with the second IC chip, wherein the first IC chip comprises:

first interface circuits configured to interface the first IC chip to the buses that couple the first IC chip with the second IC chip, drive signals to the buses for transmission to the second IC chip, and receive signals that are transmitted on the buses from the second IC chip; and a first control circuit configured to, in response to an instruction to change a data bandwidth on a data bus of the buses, control the first interface circuits to transmit information signals to the second IC chip to inform an updated ratio of an updated transmission rate for a command bus of the buses to an updated transmission rate for the data bus of the buses, and configure the first interface circuits according to the updated ratio and control the first interface circuits to transmit/receive signals on the buses according to the updated ratio.

12. The apparatus of claim 11, wherein the second IC chip comprises:

memory arrays for data storage;

second interface circuits configured to interface the memory arrays to the buses; and a second control circuit configured to detect the updated ratio indicated by the information signals, and in response to the detected updated ratio, configure the second interface circuits according to the updated ratio and control the second interface circuits to transmit/receive signals according to the updated ratio.

13. The apparatus of claim 12, wherein the second IC chip comprises:

a data strobe generation circuit configured to generate a data strobe signal based on a received clock signal with a configurable ratio, wherein the second control circuit is configured to change the configurable ratio according to the updated ratio.

14. The apparatus of claim 11, wherein the first control circuit is configured to control the first interface circuits to transmit command signals using the command bus to the second IC chip to inform the updated ratio.

15. The apparatus of claim 11, wherein the first control circuit is configured to control the first interface circuits to change a characteristic of a clock signal to the second chip to indicate the updated ratio.

16. The apparatus of claim 11, wherein the first control circuit of the first IC chip is configured to set the updated ratio in a manner that a relative change between the updated transmission rate for the command bus and a previous transmission rate for the command bus is less than a relative change between the updated transmission rate for the data bus and a previous transmission rate for the data bus.

17. A method for memory access, comprising:

receiving, by a control circuit in an integrated circuit (IC) chip, an instruction to change a data bandwidth on a data bus of buses that couple the IC chip with a memory chip;

controlling, in response to the instruction, interface circuits of the IC chip to transmit information signals to the memory chip to inform an updated ratio of an updated transmission rate for a command bus of the buses to an updated transmission rate for the data bus of the buses;

configuring the interface circuits according to the updated ratio; and controlling the interface circuits to transmit/receive signals on the buses according to the updated ratio.

18. The method of claim 16, further comprising:
adjusting, according to the updated ratio, a configurable ratio for a data strobe generation circuit that generates a data strobe signal based on a clock signal with the configurable ratio.

19. The method of claim 16, further comprising setting the updated ratio in a manner that a relative change between the updated transmission rate for the command bus and a previous transmission rate for the command bus is less than a relative change between the updated transmission rate for the data bus and a previous transmission rate for the data bus.

20. The method of claim 16, further comprising setting the updated ratio to maintain a previous transmission rate for the command bus as the updated transmission rate for the command bus.

* * * * *